(12) United States Patent
Kim

(10) Patent No.: US 8,441,283 B2
(45) Date of Patent: May 14, 2013

(54) INTEGRATED CIRCUIT

(75) Inventor: Jae Heung Kim, Suwon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/191,578

(22) Filed: Jul. 27, 2011

(65) Prior Publication Data

US 2012/0256655 A1 Oct. 11, 2012

(30) Foreign Application Priority Data

Apr. 11, 2011 (KR) .................. 10-2011-0033423

(51) Int. Cl.
*H03K 19/003* (2006.01)

(52) U.S. Cl.
USPC ............................. 326/30; 326/82

(58) Field of Classification Search ............ 326/30
See application file for complete search history.

(56) References Cited

U.S. PATENT DOCUMENTS

2008/0048714 A1* 2/2008 Lee et al. .................. 326/30
2009/0146685 A1* 6/2009 Kim et al. .................. 326/33

FOREIGN PATENT DOCUMENTS

KR 1020070045017 A 11/2008

* cited by examiner

*Primary Examiner* — Crystal L Hammond

(74) *Attorney, Agent, or Firm* — William Park & Associates Patent Ltd.

(57) ABSTRACT

An integrated circuit includes: an on-die-termination (ODT) circuit configured to drive an input signal with drivability adjusted according to an impedance calibration code and a reference voltage; and an input buffer configured to buffer the input signal in response to the reference voltage and generate an output signal.

20 Claims, 8 Drawing Sheets

INTEGRATED CIRCUIT

CROSS-REFERENCES TO RELATED APPLICATIONS

The present application claims priority under 35 U.S.C. 119(a) to Korean Application No. 10-2011-0033423, filed on Apr. 11, 2011, in the Korean intellectual property Office, which is incorporated herein by reference in its entirety.

BACKGROUND

To increase the operating speed of a semiconductor memory device, a synchronous memory device capable of operating in synchronization with a clock has been introduced. An early synchronous memory device is a single data rate (SDR) synchronous memory device which inputs or outputs one data through a single data pin in synchronization with a rising edge of a clock. However, an SDR synchronous memory device could not sufficiently meet high-speed operation requirements of systems. In this regard, a double data rate (DDR) synchronous memory device capable of processing two data in one clock cycle has been introduced.

A DDR synchronous memory device successively inputs or outputs two data through each data input/output pin in synchronization with rising and falling edges of an external clock. Therefore, the DDR synchronous memory device can implement at least two times the bandwidth of the SDR synchronous memory device without increasing the frequency of a clock. Hence, the DDR synchronous memory device can implement a high-speed operation as much.

Meanwhile, a receiving end or a transmitting end of a semiconductor memory device is coupled to a termination resistor having an equivalent resistance to the outside of the semiconductor memory device, e.g., a characteristic impedance of a transmission channel. The termination resistor is used for impedance matching, e.g., between the impedance of the receiving end or the transmitting end and the characteristic impedance of the transmission channel, thus suppressing the reflection of signals transmitted through the transmission channel. While a conventional termination resistor has been installed outside a semiconductor chip such as a printed circuit board, an on-die-termination (ODT) circuit in which a termination resistor is installed in the inside of the semiconductor chip has recently been widely used. Since an ODT circuit includes a switching circuit that controls a current flowing through the inside by an on/off operation, it has lower power consumption than that of the termination resistor installed outside the semiconductor chip. Since the resistance of the ODT circuit is changed according to the variation of process, voltage and temperature (PVT), a process of calibrating the resistance of the ODT circuit using an impedance calibration circuit (also known as a ZQ calibration circuit) is carried out.

FIG. 1 is a circuit diagram of a known input buffer.

Referring to FIG. 1, the known input buffer buffers an input signal VIN in response to a reference voltage VREF and generates an output signal VOUT. In general, the output signal VOUT of the input buffer is designed to maintain a 50% duty ratio like the input signal VIN.

However, if the level of the reference voltage VREF inputted to the input buffer becomes changed, the duty ratio of the output signal VOUT may become changed to cause loss of data loaded on the output signal VOUT, which will be described in detail with reference to FIG. 2.

If the reference voltage VREF has the same level as a set voltage VSET, the output signal VOUT has a 50% duty ratio like the input signal VIN as illustrated in a waveform (1) of FIG. 2. Therefore, data contained in the output signal VOUT is not lost.

If the reference voltage VREF is changed to a level VSET+ ΔV higher than the set voltage VSET, the duty ratio of the output signal VOUT decreases as illustrated in a waveform (2) of FIG. 2. Therefore, logic-low-level data contained in the output signal VOUT may be lost.

If the reference voltage VREF is changed to a level VSET- ΔV lower than the set voltage VSET, the duty ratio of the output signal VOUT increases as illustrated in a waveform (3) of FIG. 2. Therefore, logic-high-level data contained in the output signal VOUT may be lost.

SUMMARY

An embodiment of the present invention is directed to an integrated circuit that adjusts the drivability of an ODT circuit according to a variation in a level of a reference voltage, thereby preventing loss of data contained in an output signal of an input buffer.

In one embodiment, an integrated circuit includes: an on-die-termination (ODT) circuit configured to drive an input signal with drivability adjusted according to an impedance calibration code and a reference voltage; and an input buffer configured to buffer the input signal in response to the reference voltage and generate an output signal.

In another embodiment, an integrated circuit includes: a pull-up unit configured to pull-up drive an input signal in response to a pull-up code and a reference voltage, wherein the pull-up unit pull-up drives the input signal with higher drivability as the level of the reference voltage is increased; and an input buffer configured to buffer the input signal in response to the reference voltage and generate an output signal.

In another embodiment, an integrated circuit includes: a code generation unit configured to generate a pull-down code counted according to a level of a reference voltage; an ODT circuit configured to pull-down drive an input signal with drivability adjusted according to the pull-down code; and an input buffer configured to buffer the input signal in response to the reference voltage and generate an output signal.

In another embodiment, an integrated circuit includes: a code generation unit configured to generate a pull-up code counted according to a level of a reference voltage; an ODT circuit including a pull-up unit configured to pull-up drive an input signal with drivability adjusted according to the pull-up code; and an input buffer configured to buffer the input signal in response to the reference voltage and generate an output signal.

In another embodiment, an integrated circuit includes: a code generation unit configured to generate a pull-up code and a pull-down code counted according to a level of a reference voltage; a pull-up unit configured to pull-up drive an input signal with drivability adjusted according to the pull-up code; a pull-down unit configured to pull-down drive the input signal with drivability adjusted according to the pull-down code; and an input buffer configured to buffer the input signal in response to the reference voltage and generate an output signal.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
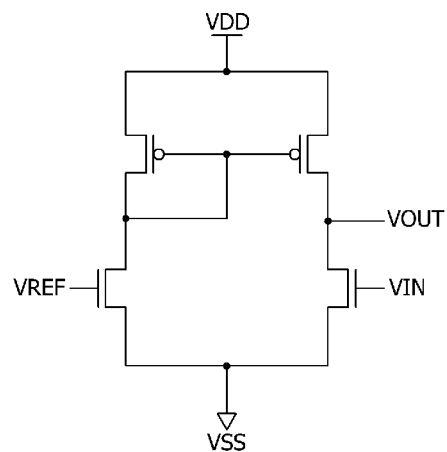
FIG. 1 is a circuit diagram of a known input buffer.
Figure 2:
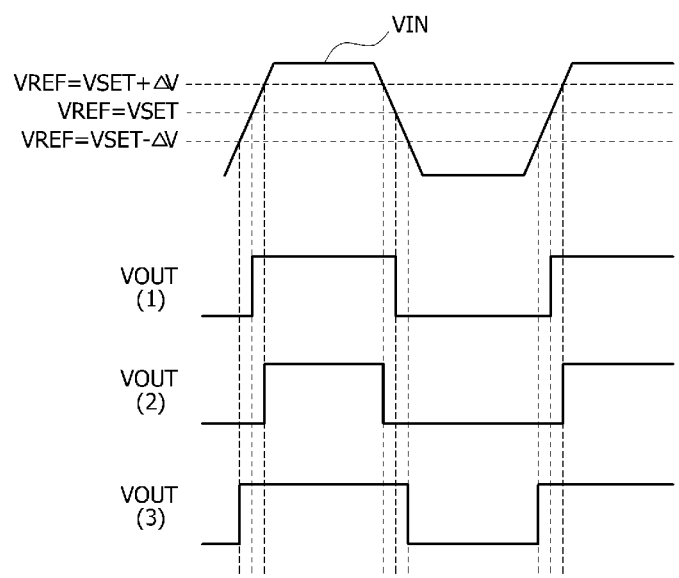
FIG. 2 is a waveform diagram of an output signal of the input buffer illustrated in FIG. 1 according to a level of a reference voltage.
Figure 3:
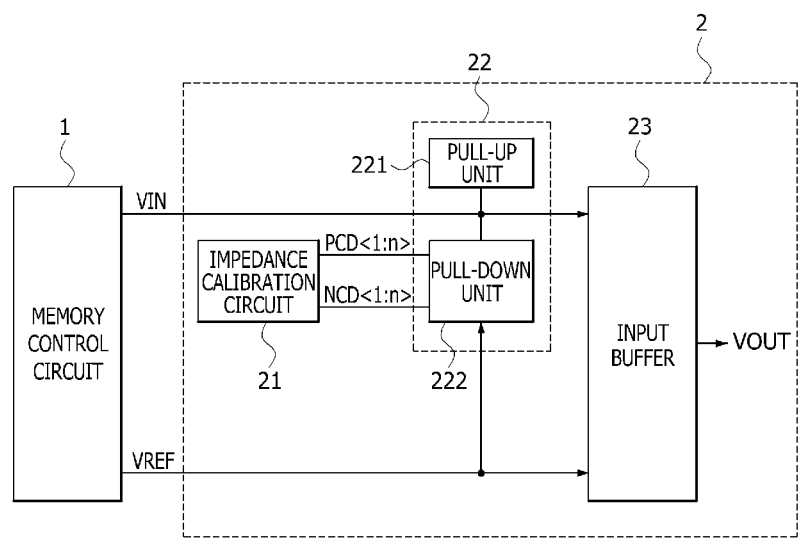
FIG. 3 is a block diagram illustrating the configuration of an integrated circuit according to an embodiment of the present invention.

FIG. 3 is a block diagram illustrating the configuration of an integrated circuit according to an embodiment of the present invention.

Referring to FIG. 3, the integrated circuit according to the embodiment of the present invention includes a semiconductor memory device 2 that receives an input signal VIN and a reference voltage VREF from a memory control circuit 1.

The semiconductor memory device 2 includes an impedance calibration circuit 21, an ODT circuit 22, and an input buffer 23. The impedance calibration circuit 21 is configured to generate pull-up codes PCD<1:n> and pull-down codes NCD<1:n> for impedance calibration. The ODT circuit 22 is configured to drive the input signal VIN with drivability adjusted according to the pull-up codes PCD<1:n>, the pull-down codes NCD<1:n>, and the reference voltage VREF. The input buffer 23 is configured to buffer the input signal VIN in response to the reference voltage VREF and generate the output signal VOUT.

Figure 4:
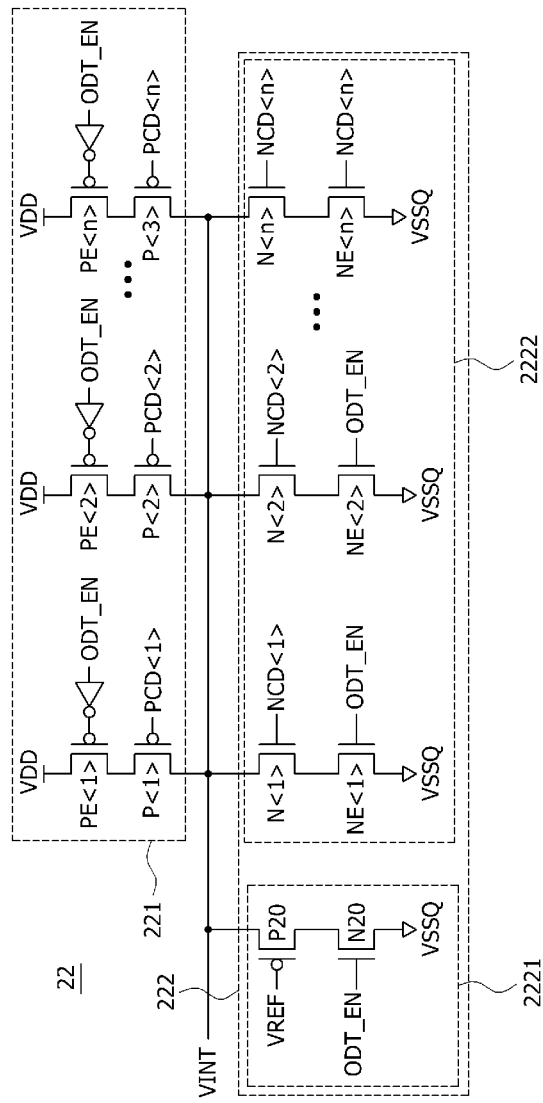
FIG. 4 is a circuit diagram of an ODT circuit included in the integrated circuit of FIG. 3.

Referring to FIG. 4, the ODT circuit 22 includes a pull-up unit 221 and a pull-down unit 222. The pull-down unit 222 includes a first pull-down unit 2221 and a second pull-down unit 2222. The pull-up unit 221 includes PMOS transistors PE<1:n> and PMOS transistors P<1:n>. The PMOS transistors PE<1:n> are configured to be turned on in response to an enable signal ODT_EN of a logic high level after the operation of the ODT circuit 22 is started. The PMOS transistors P<1:n> are configured to be selectively turned on in response to the pull-up codes PCD<1:n> to adjust the drivability thereof. The first pull-down unit 2221 includes an NMOS transistor N20 and a PMOS transistor P20. The NMOS transistor N20 is configured to be turned on in response to the enable signal ODT_EN. The PMOS transistor P20 is configured to adjust the drivability thereof by adjusting a turn-on resistance according to the level of the reference voltage VREF. The second pull-down unit 2222 includes NMOS transistors NE<1:n> and NMOS transistors N<1:n>. The NMOS transistors NE<1:n> are configured to be turned on in response to the enable signal ODT_EN. The NMOS transistors N<1:n> are configured to be selectively turned on in response to the pull-down codes NCD<1:n> and adjust the drivability of the ODT circuit 22.

The operation of the integrated circuit configured as above will be described below, based on two cases: a case where the level of the reference voltage VREF becomes changed to a level higher than a set voltage, and a case where the level of the reference voltage VREF becomes changed to a level lower than the set voltage. It is assumed that the levels of the pull-up codes PCD<1:n> and the pull-down codes NCD<1:n> are constantly maintained.

If the level of the reference voltage VREF becomes changed to a level higher than the set voltage, the turn-on resistance of the PMOS transistor P20 increases, resulting in reduction in the drivability of the first pull-down unit 2221 that pull-down drives the input signal VIN. As the level of the reference voltage VREF increases, the level of the input signal VIN also increases and therefore the duty ratio of the output signal VOUT generated by the input buffer 23 is constantly maintained.

Meanwhile, if the level of the reference voltage VREF becomes changed to a level lower than the set voltage, the turn-on resistance of the PMOS transistor P20 decreases, resulting in increase in the drivability of the first pull-down unit 2221 that pull-down drives the input signal VIN. As the level of the reference voltage VREF decreases, the level of the input signal VIN also decreases and therefore the duty ratio of the output signal VOUT generated by the input buffer 23 is constantly maintained.

The integrated circuit according to the embodiment described above changes the level of the input signal VIN by adjusting the drivability of the first pull-down unit 2221 according to the variation in the level of the reference voltage VREF. Therefore, the duty ratio of the output signal VOUT generated by the input buffer 23 is constantly maintained to reduce/minimize loss of data contained in the output signal VOUT.

According to embodiments, the integrated circuit may be designed to adjust the pull-up drivability for the input signal VIN according to the variation in the level of the reference voltage VREF, or to adjust both of the pull-up drivability for the input signal VIN and the pull-down drivability for the input signal VIN according to the variation in the level of the reference voltage VREF. In addition, according to embodiments, the integrated circuit may be designed so that the reference voltage VREF is not applied from the memory control circuit 1 but is generated by a reference voltage generation circuit included in the semiconductor memory device 2.

Figure 5:
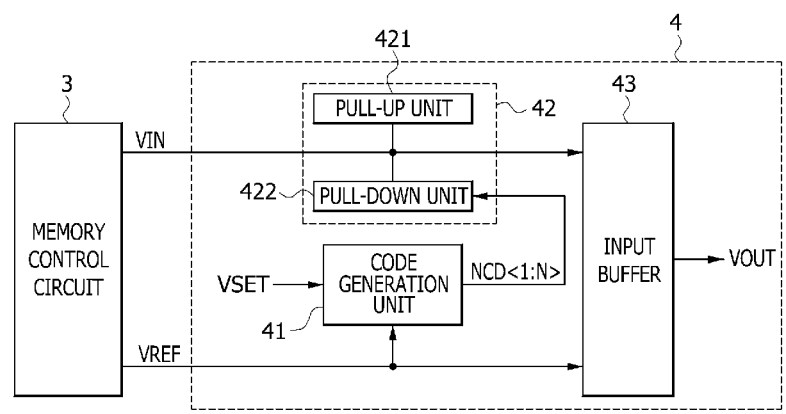
FIG. 5 is a block diagram illustrating the configuration of an integrated circuit according to another embodiment of the present invention.

FIG. 5 is a block diagram illustrating the configuration of an integrated circuit according to another embodiment of the present invention.

Referring to FIG. 5, the integrated circuit includes a semiconductor memory device 4 that receives an input signal VIN and a reference voltage VREF from a memory control circuit 3.

The semiconductor memory device 4 includes a code generation unit 41, an ODT circuit 42, and an input buffer 43. The code generation unit 41 is configured to generate pull-down codes NCD<1:N> counted according to the level of the reference voltage VREF. The ODT circuit 42 includes a pull-up unit 421 and a pull-down unit 422. The ODT circuit 42 is configured to drive the input signal VIN with drivability adjusted according to the pull-down codes NCD<1: N>. The input buffer 43 is configured to buffer the input signal VIN in response to the reference voltage VREF and generate the output signal VOUT.

Figure 6:
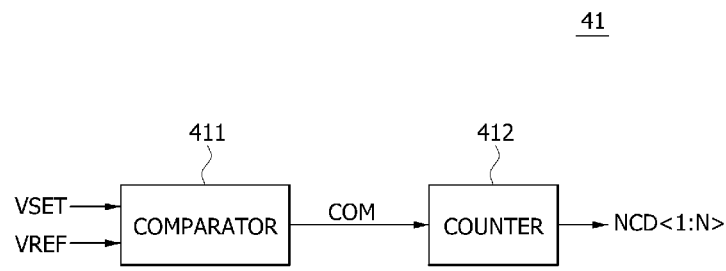
FIG. 6 is a block diagram of a code generation unit included in the integrated circuit of FIG. 5.

Referring to FIG. 6, the code generation unit 41 includes a comparator 411 and a counter 412. The comparator 411 is configured to compare the level of a set voltage VSET with the level of the reference voltage VREF and generate a comparison signal COM. The counter 412 is configured to count and output the pull-down codes NCD<1:N> in response to the comparison signal COM. The code generation unit 41 configured as above counts and outputs the pull-down codes NCD<1:N> in order to reduce the drivability of the pull-down unit 422 when the reference voltage VREF becomes changed to a level higher than the set voltage VSET, and counts and outputs the pull-down codes NCD<1:N> in order to increase the drivability of the pull-down unit 422 when the reference voltage VREF becomes changed to a level lower than the set voltage VSET.

Figure 7:
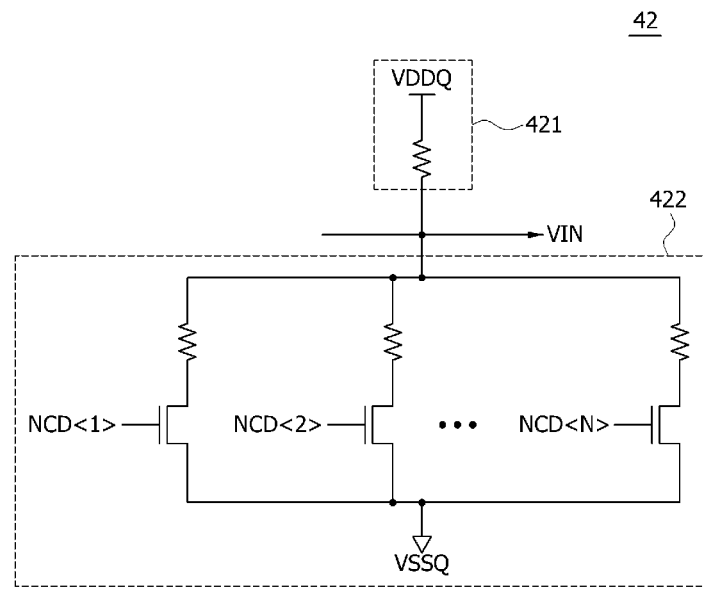
FIG. 7 is a circuit diagram of an ODT circuit included in the integrated circuit of FIG. 5.

Referring to FIG. 7, the pull-up unit 421 is configured to pull-up drive the input signal VIN with constant drivability. The pull-down unit 422 is configured to pull-down drive the input signal VIN with drivability adjusted by the pull-down codes NCD<1:N>. More specifically, the pull-down unit 422 pull-down drives the input signal VIN with low drivability when the reference voltage VREF becomes changed to a level higher than the set voltage VSET, and pull-up drives the input signal VIN with high drivability when the reference voltage VREF becomes changed to a level lower than the set voltage VSET.

The operation of the integrated circuit configured as above will be described below, based on two cases: a case where the level of the reference voltage VREF becomes changed to a level higher than the set voltage VSET, and a case where the level of the reference voltage VREF becomes changed to a level lower than the set voltage VSET.

If the level of the reference voltage VREF becomes changed to a level higher than the set voltage VSET, the code generation unit 41 counts and outputs the pull-down codes NCD<1:N> in order to reduce the drivability of the pull-down unit 422. As the level of the reference voltage VREF increases, the level of the input signal VIN also increases and therefore the duty ratio of the output signal VOUT generated by the input buffer 43 is constantly maintained.

Meanwhile, if the level of the reference voltage VREF becomes changed to a level lower than the set voltage VSET, the code generation unit 41 counts and outputs the pull-down codes NCD<1:N> in order to increase the drivability of the pull-down unit 422. As the level of the reference voltage VREF is reduced, the level of the input signal VIN is also reduced and therefore the duty ratio of the output signal VOUT generated by the input buffer 43 is constantly maintained.

The integrated circuit according to the embodiment described above changes the level of the input signal VIN by adjusting the drivability of the pull-down unit 422 according to the variation in the level of the reference voltage VREF. Therefore, the duty ratio of the output signal VOUT generated by the input buffer 43 is constantly maintained to reduce/minimize loss of data contained in the output signal VOUT.

According to embodiments, the integrated circuit may be designed so that the reference voltage VREF is not applied from the memory control circuit 3 but is generated by a reference voltage generation circuit included in the semiconductor memory device 4.

Figure 8:
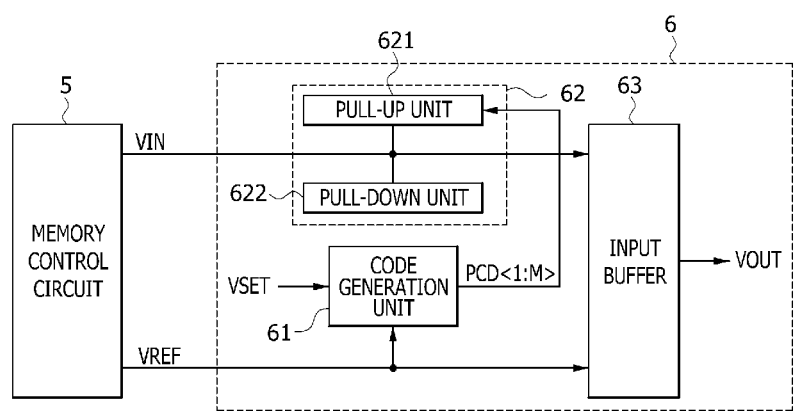
FIG. 8 is a block diagram illustrating the configuration of an integrated circuit according to another embodiment of the present invention.

FIG. 8 is a block diagram illustrating the configuration of an integrated circuit according to another embodiment of the present invention.

Referring to FIG. 8, the integrated circuit includes a semiconductor memory device 6 that receives an input signal VIN and a reference voltage VREF from a memory control circuit 5.

The semiconductor memory device 6 includes a code generation unit 61, an ODT circuit 62, and an input buffer 63. The code generation unit 61 is configured to generate pull-up codes PCD<1:M> counted according to the level of the reference voltage VREF. The ODT circuit 62 includes a pull-up unit 621 and a pull-down unit 622. The ODT circuit 62 is configured to drive the input signal VIN with drivability adjusted according to the pull-up codes PCD<1:M>. The input buffer 63 is configured to buffer the input signal VIN in response to the reference voltage VREF and generate the output signal VOUT.

Figure 9:
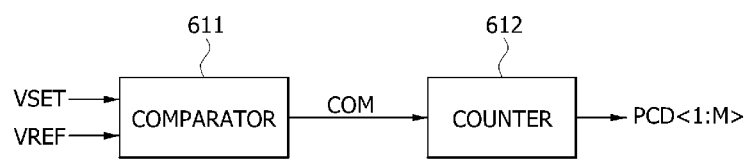
FIG. 9 is a block diagram of a code generation unit included in the integrated circuit of FIG. 8.

Referring to FIG. 9, the code generation unit 61 includes a comparator 611 and a counter 612. The comparator 611 is configured to compare the level of a set voltage VSET with the level of the reference voltage VREF and generate a comparison signal COM. The counter 612 is configured to count and output the pull-up codes PCD<1:M> in response to the comparison signal COM. The code generation unit 61 configured as above counts and outputs the pull-up codes PCD<1:M> in order to increase the drivability of the pull-up unit 621 when the reference voltage VREF becomes changed to a level higher than the set voltage VSET, and counts and outputs the pull-up codes PCD<1:M> in order to reduce the drivability of the pull-up unit 621 when the reference voltage VREF becomes changed to a level lower than the set voltage VSET.

Figure 10:
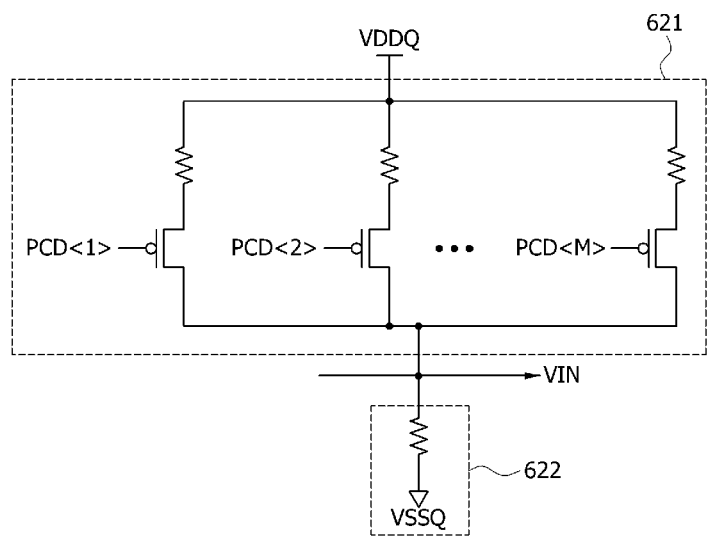
FIG. 10 is a circuit diagram of an ODT circuit included in the integrated circuit of FIG. 8.

Referring to FIG. 10, the pull-up unit 621 is configured to pull-up drive the input signal VIN with the drivability adjusted by the pull-up codes PCD<1:M>. The pull-down unit 622 is configured to pull-down drive the input signal VIN with constant drivability.

The operation of the integrated circuit configured as above will be described below, based on two cases: a case where the level of the reference voltage VREF becomes changed to a level higher than the set voltage VSET, and a case where the level of the reference voltage VREF becomes changed to a level lower than the set voltage VSET.

If the level of the reference voltage VREF becomes changed to a level higher than the set voltage VSET, the code generation unit 61 counts and outputs the pull-up codes PCD<1:M> in order to increase the drivability of the pull-up unit 621. As the level of the reference voltage VREF increases, the level of the input signal VIN also increases and therefore the duty ratio of the output signal VOUT generated by the input buffer 63 is constantly maintained.

Meanwhile, if the level of the reference voltage VREF becomes changed to a level lower than the set voltage VSET, the code generation unit 61 counts and outputs the pull-up codes PCD<1:M> in order to reduce the drivability of the pull-up unit 621. As the level of the reference voltage VREF is reduced, the level of the input signal VIN is also reduced and therefore the duty ratio of the output signal VOUT generated by the input buffer 63 is constantly maintained.

The integrated circuit according to the embodiment described above changes the level of the input signal VIN by adjusting the drivability of the pull-up unit 621 according to the variation in the level of the reference voltage VREF.

Therefore, the duty ratio of the output signal VOUT generated by the input buffer 63 is constantly maintained to reduce/minimize loss of data contained in the output signal VOUT.

According to embodiments, the integrated circuit may be designed so that the reference voltage VREF is not applied from the memory control circuit 5 but is generated by a reference voltage generation circuit included in the semiconductor memory device 6.

Figure 11:
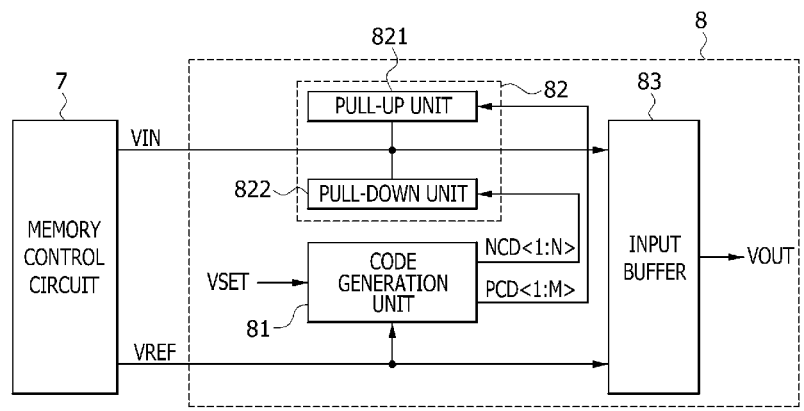
FIG. 11 is a block diagram illustrating the configuration of an integrated circuit according to another embodiment of the present invention.

FIG. 11 is a block diagram illustrating the configuration of an integrated circuit according to another embodiment of the present invention.

Referring to FIG. 11, the integrated circuit includes a semiconductor memory device 8 that receives an input signal VIN and a reference voltage VREF from a memory control circuit 7.

The semiconductor memory device 8 includes a code generation unit 81, an ODT circuit 82, and an input buffer 83. The code generation unit 81 is configured to generate pull-down codes NCD<1:N> and pull-up codes PCD<1:M> counted according to the level of the reference voltage VREF. The ODT circuit 82 includes a pull-up unit 821 and a pull-down unit 822. The ODT circuit 82 is configured to drive the input signal VIN with the drivability adjusted according to the pull-down codes NCD<1:N> and the pull-up codes PCD<1:M>. The input buffer 83 is configured to buffer the input signal VIN in response to the reference voltage VREF and generate the output signal VOUT.

Figure 12:
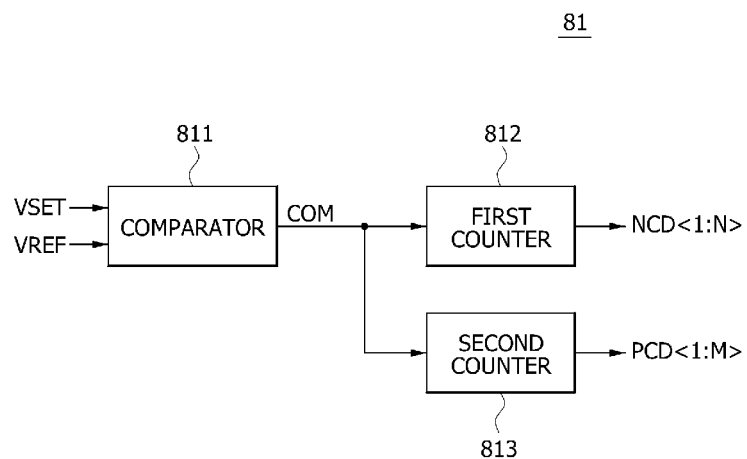
FIG. 12 is a block diagram of a code generation unit included in the integrated circuit of FIG. 11.

Referring to FIG. 12, the code generation unit 81 includes a comparator 811, a first counter 812, and a second counter 813. The comparator 811 is configured to compare the level of a set voltage VSET with the level of the reference voltage VREF and generate a comparison signal COM. The first counter 812 is configured to count and output the pull-down codes NCD<1:N> in response to the comparison signal COM. The second counter 813 is configured to count and output the pull-up codes PCD<1:M> in response to the comparison signal COM. The code generation unit 81 configured as above counts and outputs the pull-down codes NCD<1:N> in order to reduce the drivability of the pull-down unit 822 and counts and outputs the pull-up codes PCD<1:M> in order to increase the drivability of the pull-up unit 821 when the reference voltage VREF becomes changed to a level higher than the set voltage VSET. The code generation unit 81 configured as above counts and outputs the pull-down codes NCD<1:N> in order to increase the drivability of the pull-down unit 822 and counts and outputs the pull-up codes PCD<1:M> in order to reduce the drivability of the pull-up unit 821 when the reference voltage VREF becomes changed to a level lower than the set voltage VSET.

Figure 13:
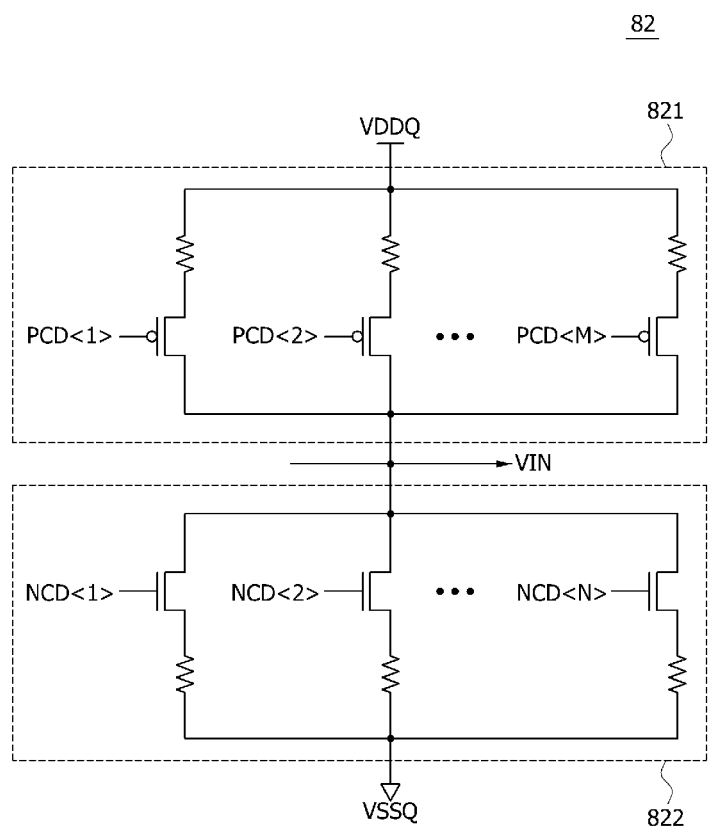
FIG. 13 is a circuit diagram of an ODT circuit included in the integrated circuit of FIG. 11.

Referring to FIG. 13, the pull-up unit 821 is configured to pull-up drive the input signal VIN with the drivability adjusted by the pull-up codes PCD<1:M>. The pull-down unit 822 is configured to pull-down drive the input signal VIN with the drivability adjusted by the pull-down codes NCD<1:N>.

The operation of the integrated circuit configured as above will be described below, based on two cases: a case where the level of the reference voltage VREF becomes changed to a level higher than the set voltage VSET, and a case where the level of the reference voltage VREF becomes changed to a level lower than the set voltage VSET.

If the level of the reference voltage VREF becomes changed to a level higher than the set voltage VSET, the code generation unit 81 counts and outputs the pull-down codes NCD<1:N> in order to reduce the drivability of the pull-down unit 822 and counts and outputs the pull-up codes PCD<1:M> in order to increase the drivability of the pull-up unit 821. As the level of the reference voltage VREF increases, the level of the input signal VIN also increases and therefore the duty ratio of the output signal VOUT generated by the input buffer 83 is constantly maintained.

Meanwhile, if the level of the reference voltage VREF becomes changed to a level lower than the set voltage VSET, the code generation unit 81 counts and outputs the pull-down codes NCD<1:N> in order to increase the drivability of the pull-down unit 822 and counts and outputs the pull-up codes PCD<1:M> in order to reduce the drivability of the pull-up unit 821. As the level of the reference voltage VREF is reduced, the level of the input signal VIN is also reduced and therefore the duty ratio of the output signal VOUT generated by the input buffer 83 is constantly maintained.

The integrated circuit according to the embodiment described above changes the level of the input signal VIN by adjusting the drivability of the pull-up unit 821 and the pull-down unit 822 according to the variation in the level of the reference voltage VREF. Therefore, the duty ratio of the output signal VOUT generated by the input buffer 83 is constantly maintained to reduce/minimize loss of data contained in the output signal VOUT.

According to embodiments, the integrated circuit may be designed so that the reference voltage VREF is not applied from the memory control circuit 7 but is generated by a reference voltage generation circuit included in the semiconductor memory device 8.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. An integrated circuit comprising:
    an on-die-termination (ODT) circuit configured to drive an input signal with drivability adjusted according to an impedance calibration code and a reference voltage; and
    an input buffer configured to buffer the input signal in response to the reference voltage and generate an output signal, wherein the ODT circuit comprises a first MOS transistor and a second MOS transistor, the first MOS transistor is turned on in response to the reference voltage, and the second MOS transistor is turned on in response to the impedance calibration code.

2. The integrated circuit of claim 1, wherein the ODT circuit reduces the level of the input signal when the level of the reference voltage decreases, and increases the level of the input signal when the level of the reference voltage increases.

3. The integrated circuit of claim 1, wherein the ODT circuit comprises a pull-down unit configured to pull-down drive the input signal in response to a pull-down code and the reference voltage, and the pull-down unit pull-down drives the input signal with lower drivability as the level of the reference voltage increases.

4. The integrated circuit of claim 3, wherein the pull-down unit comprises:
    a first pull-down unit configured to comprise the first MOS transistor, and pull-down drive the input signal with the drivability adjusted according to the level of the reference voltage; and
    a second pull-down unit configured to comprise the first MOS transistor, and pull-down drive the input signal with the drivability adjusted according to the pull-down code.

5. The integrated circuit of claim 3, wherein the ODT circuit further comprises a pull-up unit configured to pull-up drive the input signal with drivability adjusted according to a pull-up code.

6. The integrated circuit of claim 3, wherein the ODT circuit comprises a pull-up unit configured to pull-up drive the input signal in response to a pull-up code and the reference voltage, and the pull-up unit pull-up drives the input signal with higher drivability as the level of the reference voltage increases.

7. The integrated circuit of claim 1, wherein the input signal and the reference voltage are applied from a memory control circuit.

8. An integrated circuit comprising:
  a pull-up unit configured to pull-up drive an input signal in response to a pull-up code and a reference voltage, wherein the pull-up unit pull-up drives the input signal with higher drivability as the level of the reference voltage increases; and
  an input buffer configured to buffer the input signal in response to the reference voltage and generate an output signal, wherein the pull-up unit comprises a first MOS transistor and a second MOS transistor, the first MOS transistor is turned on in response to the reference voltage, and the second MOS transistor is turned on in response to the impedance calibration code.

9. The integrated circuit of claim 8, wherein the pull-up unit comprises:
  a first pull-up unit configured to comprise the first MOS transistor, and pull-up drive the input signal with drivability adjusted according to the level of the reference voltage; and
  a second pull-up unit configured to comprise the second MOS transistor, and pull-up drive the input signal with drivability adjusted according to the pull-up code.

10. The integrated circuit of claim 8, further comprising a pull-down unit configured to pull-down drive the input signal with drivability adjusted according to a pull-down code.

11. An integrated circuit comprising:
  a comparator configured to compare the reference voltage with a set voltage having a predetermined level and generate a comparison signal;
  a counter configured to output the pull-down code in response to the comparison signal;
  an ODT circuit configured to pull-down drive an input signal with drivability adjusted according to the pull-down code; and
  an input buffer configured to buffer the input signal in response to the reference voltage and generate an output signal.

12. The integrated circuit of claim 11, wherein the pull-down unit pull-down drives the input signal with lower drivability as the level of the reference voltage increases.

13. The integrated circuit of claim 12, wherein the ODT circuit further comprises a pull-up unit configured to pull-up drive the input signal with constant drivability.

14. An integrated circuit comprising:
  a comparator configured to compare the reference voltage with a set voltage having a predetermined level and generate a comparison signal;
  a counter configured to output the pull-up code in response to the comparison signal;
  an ODT circuit including a pull-up unit configured to pull-up drive an input signal with drivability adjusted according to the pull-up code; and
  an input buffer configured to buffer the input signal in response to the reference voltage and generate an output signal.

15. The integrated circuit of claim 14, wherein the pull-up unit pull-up drives the input signal with higher drivability as the level of the reference voltage increases.

16. The integrated circuit of claim 15, wherein the ODT circuit further comprises a pull-down unit configured to pull-down drive the input signal with constant drivability.

17. An integrated circuit comprising:
  a comparator configured to compare the reference voltage with a set voltage having a predetermined level and generate a comparison signal;
  a first counter configured to output the pull-down code in response to the comparison signal;
  a second counter configured to output the pull-up code in response to the comparison signal;
  a pull-up unit configured to pull-up drive an input signal with drivability adjusted according to the pull-up code;
  a pull-down unit configured to pull-down drive the input signal with drivability adjusted according to the pull-down code; and
  an input buffer configured to buffer the input signal in response to the reference voltage and generate an output signal.

18. The integrated circuit of claim 17, wherein the code generation unit comprises:
  a comparator configured to compare the reference voltage with a set voltage and generate a comparison signal;
  a first counter configured to output the pull-down code in response to the comparison signal; and
  a second counter configured to output the pull-up code in response to the comparison signal.

19. The integrated circuit of claim 17, wherein the pull-up unit pull-up drives the input signal with higher drivability as the level of the reference voltage increases.

20. The integrated circuit of claim 17, wherein the pull-down unit pull-down drives the input signal with lower drivability as the level of the reference voltage increases.

* * * * *